United States Patent
Kho et al.

(10) Patent No.: US 8,436,122 B2
(45) Date of Patent: May 7, 2013

(54) PRESSURE SENSITIVE ADHESIVE COMPOSITION FOR TRANSPORTING FLEXIBLE SUBSTRATE

(75) Inventors: Dong-Han Kho, Daegu (KR); Sang-Ki Chun, Daejeon (KR); Se-Ra Kim, Daejeon (KR); Suk-Ky Chang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 19 days.

(21) Appl. No.: 12/225,435

(22) PCT Filed: Mar. 22, 2007

(86) PCT No.: PCT/KR2007/001409
§ 371 (c)(1),
(2), (4) Date: Sep. 10, 2009

(87) PCT Pub. No.: WO2007/108659
PCT Pub. Date: Sep. 27, 2007

(65) Prior Publication Data
US 2010/0038023 A1    Feb. 18, 2010

(30) Foreign Application Priority Data
Mar. 23, 2006    (KR) .................. 10-2006-0026369

(51) Int. Cl.
*C08G 77/20*    (2006.01)
(52) U.S. Cl.
USPC ............................................. 528/32; 528/12
(58) Field of Classification Search ...... 528/32, 528/12
See application file for complete search history.

(56) References Cited

U.S. PATENT DOCUMENTS

| | | | |
|---|---|---|---|
| 6,037,026 A | 3/2000 | Iwamoto | |
| 6,124,407 A * | 9/2000 | Lee et al. | 525/478 |
| 6,199,318 B1 * | 3/2001 | Stewart et al. | 47/57.6 |
| 2003/0114560 A1 * | 6/2003 | Yang et al. | 524/154 |
| 2006/0057368 A1 * | 3/2006 | Kobayashi et al. | 428/343 |

FOREIGN PATENT DOCUMENTS

| | | |
|---|---|---|
| CN | 1749344 A | 3/2006 |
| JP | 03-5718 | 1/1991 |
| JP | 07-022795 | 1/1995 |
| JP | 07-325297 A | 12/1995 |
| JP | 09-219569 | 8/1997 |
| JP | 09-512567 | 12/1997 |
| JP | 2000-261193 A | 9/2000 |
| JP | 2001-106994 | 4/2001 |
| JP | 2001-146578 | 5/2001 |
| JP | 2002-146314 | 5/2002 |
| JP | 2002 258252 * | 9/2002 |
| JP | 2002-258252 A | 9/2002 |
| JP | 2002-314240 A | 10/2002 |
| JP | 2003-273493 A | 9/2003 |
| JP | 2003-273592 | 9/2003 |
| JP | 2005-298550 | 10/2005 |
| JP | 2005-298550 A | 10/2005 |
| JP | 2006-063311 | 3/2006 |
| JP | 2006-225420 A | 8/2006 |
| WO | WO 95/30720 | 11/1995 |
| WO | WO 03/011958 A1 | 2/2003 |
| WO | WO 03011958 A1 * | 2/2003 |

OTHER PUBLICATIONS

Freeman (Silicones, published for the Plastics Institute, ILIFFE Books Ltd, 1962, p. 27).*
JP 2002 258252 Machine translation.*

* cited by examiner

*Primary Examiner* — Kuo-Liang Peng
(74) *Attorney, Agent, or Firm* — McKenna Long & Aldridge, LLP

(57) ABSTRACT

Disclosed herein is an adhesive composition for transporting a flexible substrate, which is used to manufacture a flexible display device using a flexible substrate such as a plastic substrate by using a conventional line for manufacturing a liquid crystal display device comprising a glass substrate. The present invention provides an adhesive composition for transporting a flexible substrate, which includes 100 parts by weight of an adhesive for transporting a flexible substrate and 0.001 to 5 parts by weight of an antistatic agent, an adhesive sheet containing the composition, and a method of transporting a flexible substrate using the same.

15 Claims, 3 Drawing Sheets

PRESSURE SENSITIVE ADHESIVE COMPOSITION FOR TRANSPORTING FLEXIBLE SUBSTRATE

This application is a 371 national stage entry of International Application No. PCT/KR2007/001409, filed on Mar. 22, 2007 that claims priority to Korean Patent Application No. 10-2006-0026369, filed on Mar. 23, 2006, both of which are hereby incorporated by reference in their entirety.

TECHNICAL FIELD

The present invention relates to an adhesive composition for transporting a flexible substrate, which is used to manufacture a flexible display device using a flexible substrate such as a plastic substrate directly using a conventional line for manufacturing a liquid crystal display device using a glass substrate. In particular, the present invention relates to an adhesive composition for transporting a flexible substrate, which includes 100 parts by weight of an adhesive for transporting a flexible substrate and 0.001 to 5 parts by weight of an antistatic agent, an adhesive sheet containing the composition, and a method of transporting a flexible substrate using the same.

BACKGROUND ART

Static electricity variously occurs and is discharged in accordance with the generation sources thereof, such as frictional charging, contact charging and separation charging, and the generation place thereof. Such occurrence, increase and decrease of charges entail various problems in the use and processing of many industrial products and material. Static electrical charges cause materials to adhere to or repel each other, and raise the problems during product manufacturing and problems of pollution. Static electricity entails serious problems such as the destruction of devices and the malfunction of measuring instruments.

In the manufacture of a flexible display using a flexible substrate, such as a plastic substrate, according to the trend toward the use of light parts and thin parts in the field of industrial manufacturing, problems related to static electricity remain.

Recently, the use of an adhesive and a substrate for transporting a flexible substrate using a process of manufacturing a Liquid Crystal Display (LCD) panel or an Organic Light Emitting Display (OLED) panel, which is one of the conventional methods of manufacturing a flexible display, has been proposed. The method comprises attaching a flexible substrate to a transportation support formed of a relatively thick glass plate or plastic plate directly using the conventional process and apparatus for manufacturing a liquid crystal display device and then detaching the flexible substrate.

A double-sided adhesive tape, one side of which has low adhesiveness and the other side of which has a relatively high adhesiveness, a temperature sensitive adhesive, the adhesiveness of which varies with temperature, and a photosensitive adhesive, the adhesiveness of which is controlled by using light, have been proposed as a general adhesive for use in the above method. When such adhesives are used, there are advantages in that panel manufacturing lines that use the commonly used glass substrate can be used without variation, so that the investment cost of equipment for manufacturing panels comprising the flexible substrate is minimized, with the result that the panel can be manufactured at low cost. Technologies related thereto are as follows.

Japanese Unexamined Patent Publication Nos. Heisei08-53156, 2000-252342 and 2002-258252 disclose temperature sensitive adhesives which have high adhesiveness at the time of the transport and processing of electronic parts and facilitate the peeling of the electronic parts due to the increase in adhesiveness with temperature after the transport and processing thereof.

Japanese Unexamined Patent Publication No. Heisei08-53156 discloses an adhesive using a (meth)acrylic acid polymer having side-chain crystallinity, in which the carbon number of an ester thereof is 8 or more. In this cold-peelable adhesive, the ratio of the adhesiveness at a temperature lower than the melting point to the adhesiveness at a temperature higher than the melting point is from 1/1 to 1/4. Therefore, a substrate cannot be detached in a high-temperature process, but can be easily detached at a temperature lower than the (melting point −10)° C.

Japanese Unexamined Patent Publication No. 2000-252342 discloses a double-sided adhesive tape one side of which is coated with a warm-peelable adhesive and the other side of which is coated with an adhesive for bonding a support plate, like a conventional adhesive. The warm-peelable adhesive has an advantage in that, when the warm-peelable adhesive is heated to a temperature of 100° C. for 1 minute, the adhesion area is decreased due to foaming, so that the adhesiveness is decreased, thereby the warm-peelable adhesive is easily peeled off from the flexible substrate.

Japanese Unexamined Patent Publication No. 2002-258252 discloses a method of using a temperature sensitive adhesive, the adhesiveness of which varies according to a reversible change between a crystal state and an amorphous state.

However, since the adhesives described above are adhesives that contain an acrylic resin as a principal component, the properties of the adhesive are easily changed, the chemical resistance thereof is decreased, and bubbles are generated at a temperature of 150° C. or more in a Thin Film Transistor (TFT) process and/or a color filter process, which are substrate manufacturing processes for manufacturing an LCD panel or an OLED panel, therefore there is a problem in that a lithography process cannot be performed due to the low dimensional stability of the flexible, especially a plastic substrate.

Further, Japanese Unexamined Patent Publication No. 2003-27017 discloses a double-sided adhesive tape formed of a three-layered structure including a UV adhesive layer, a substrate and an adhesive layer, laminated in that order.

This double-sided tape can be easily detached by ultraviolet irradiation after processes for the liquid crystal display panel are finished, because a UV adhesive is applied to the surface of the flexible substrate on which the double sided tape is attached. However, oligomers or monomers contained in the UV adhesive are volatilized at high temperatures, thereby generating bubbles in the flexible substrate and causing the flexible substrate to peel off. A UV initiator contained in the UV adhesive can cause polymerization and curing by heating. Accordingly, even though a polymerization inhibitor is added, organic monomolecules such as oligomers or monomers are volatilized at high temperature, thereby generating bubbles in the flexible substrate.

Meanwhile, Japanese Unexamined Patent Publication No. Heisei08-086993 discloses a jig for transporting a flexible substrate, which is provided with a support that includes a pressure sensitive adhesive layer. That is, disclosed is a method of decreasing stress by forming an adhesive layer or an intermediate layer between the support of the jig and the pressure sensitive adhesive layer to prevent bubbles or peeling between the substrate and the pressure sensitive adhesive layer resulting from the stress generated by the difference in the thermal expansion coefficient. This method has an advantage in that the adhesiveness between the support and the pressure sensitive adhesive layer is increased due to the adhesive layer, thereby enabling easy removal of the flexible substrate in the final process. Although it is described in this patent document that silicon rubber, having better heat-resistance than acrylic resin, is used as the pressure sensitive adhesive, and that a jig provided with a pressure sensitive adhesive can be used several times, there have been problems in that, after the pressure sensitive adhesive has been used several times, the adhesive strength of the adhesive is decreased because extraneous materials adhere to the surface of the pressure sensitive adhesive, and the removal of the adhesive for reuse of the support cannot be easily conducted.

Even in the process of using the above tape or adhesive for transporting a substrate, static electricity can be frequently generated, and, particularly, easily generated at the time of attaching an adhesive or peeling off a release paper. Filth and dust are attached to the adhesive due to the formation or increase of static charges, and the attached pollutants deteriorate the flatness of the substrate and cause the generation of bubbles, thereby producing bad displays. Further, the generated static electricity causes the loss of adhesive or bad dimensional stability of the flexible substrate due to the phenomenon of adhesives adhering to each other, a phenomenon of an adhesive not being attached to a desired position on a support when the adhesive is attached to the support, and a phenomenon in which bubbles are generated between the adhesive and the support. Meanwhile, static electricity can be generated on the surface of the substrate even in the process of detaching the adhesive from the flexible substrate, after the processes for manufacturing the display are finished. This generated static electricity causes filth and dust to be adsorbed on the substrate or damages devices. Accordingly, it is necessary to provide antistatic properties for the adhesive for transporting the flexible substrate having heat resistance, chemical resistance and dimensional stability.

The static electricity can be prevented by removing and moving charges. The method of preventing the static electricity includes a method of using a ground, a method of increasing atmospheric humidity, a method of using a magnetic discharge type or a radiation type dust remover, a method of ionizing air, and a method of using an antistatic agent. Considering that the antistatic properties are provided for an adhesive and that the adhesive is used for electronic materials, it is preferred that the method of using the antistatic agent be used as the method of preventing static electricity because the method of using a ground, the method of increasing atmospheric humidity, the method of using a magnetic discharge type or a radiation type dust remover and the method of ionizing air pollute different electronic materials secondarily, and do not fundamentally prevent static electricity.

The antistatic agents are classified into an outer antistatic agent, which is superficially applied, and an inner antistatic agent, which is mixed in an insulating material. Generally, since the static electricity is generated, increased and decreased on the surfaces of material and moves through the surfaces of material, the inner antistatic agent, which concentrates the surface of the material and easily moves into/out of the material, is efficiently used.

Generally, a method of mixing a conductive powder with a silicon adhesive is used to provide antistatic properties for the silicon adhesive. However, when the conductive powder, which has a high specific gravity, is not mixed in a large amount, conductivity is insufficient. In contrast, when the conductive powder is mixed in a large amount, viscosity is high and workability is decreased.

Japanese Unexamined Patent Publication No. Heisei01-287169 discloses a method of preparing a silicon rubber composition having stabilized workability by diluting the composition with an organic solvent and suppressing the increase of viscosity of the composition itself. However, there are problems in that the antistatic properties and conductivity are not stabilized due to the bad precipitation and dispersion of the conductive powder, and that the low heat resistance due to the oxidation of metal powder at high temperature is not overcome.

Japanese Unexamined Patent Publication No. 2001-146578 discloses an electrically conductive silicone adhesive composition in which high heat resistance is compatible with conductivity as a conductive powder including metal powder and metal coated powder. However, there have been problems in that expensive metal powder such as copper or platinum is used, and the metal powder precipitates due to the high specific gravity thereof with the passage of time. When the metal coated powder is used, low specific gravity and conductivity are imparted to the composition, but there is a problem in that metal is peeled off due to insufficient adhesiveness between the metal powder and the metal coated powder at high temperature.

In contrast, Japanese Unexamined Patent Publication No. 2004-91750 discloses an electroconductive silicone adhesive composition, in which the silicon composition having a reducing property is applied on a substrate containing an inorganic or organic resin powder, and conductive powder coated with metal by plating is formed on the substrate, thereby lowering the specific gravity and increasing the oxidation resistance and preventing separation of the conductive powder. However, when the added powder is formed of metal and is dispersed in an adhesive due to a sizing agent, there is a problem in that the adhesive is not optically transparent, and thus the adhesive impedes the use of alignment marks of an electrode pattern at the time of manufacturing a display.

Meanwhile, carbon black, a semiconductor, or the like is used as an antistatic agent. However, since this antistatic agent does not maintain transparency at the time of the addition of the antistatic agent to an adhesive, optical properties are decreased.

DISCLOSURE

Technical Problem

Accordingly, the present invention has been made keeping in mind the above problems occurring in the prior art, and an object of the present invention is to provide an adhesive composition for transporting a flexible substrate, which can directly use conventional apparatuses and processes for manufacturing a liquid crystal display device using a glass substrate, has excellent dimensional stability, heat resistance, transmissivity, detachability and chemical resistance, and can overcome problems such increased viscosity, oxidation resistance of metal, opacity and separability of metal from powder in the conventional antistatic agent.

Another object of the present invention is to provide an adhesive sheet containing the adhesive composition.

A further object of the present invention is to provide a method of transporting a flexible substrate using the adhesive or the adhesive sheet.

Technical Solution

In order to accomplish the above object, the present invention provides an adhesive composition for transporting a flexible substrate, including 100 parts by weight of an adhesive for transporting a flexible substrate, and 0.001 to 5 parts by weight of an antistatic agent.

Further, the present invention provides an adhesive sheet including the adhesive composition for transporting a flexible substrate.

Further, the present invention provides a method of transporting a flexible substrate, including the steps of (a) forming an adhesive layer on a flexible substrate or a support, (b) attaching the flexible substrate and the support, one of which is provided with the adhesive layer, to each other and then transporting the flexible substrate and the support, and (c) separating the flexible substrate from the adhesive layer and the support, the adhesive layer including the adhesive composition for transporting a flexible substrate.

Advantageous Effects

The silicon adhesive composition according to the present invention has heat resistance, chemical resistance, close adhesion to base material, dimensional stability, and close adhesion to supports and substrates, and enables easy substrate detachability, all of which are necessary for an adhesive for transporting a flexible substrate. The composition has a function for preventing static electricity and thus preventing the attachment of filth and dust due to an electrostatic phenomenon, thereby minimizing the occurrence of faults when flexible displays using a flexible substrate such as a plastic substrate are manufactured.

BEST MODE

Figure 1:
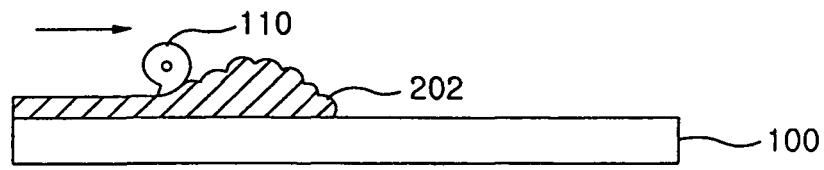
FIGS. 1 to 4 are sectional views showing a process of transporting a flexible substrate according to a first embodiment of the present invention.

Hereinafter, the present invention will be described in detail.

The adhesive for transporting the flexible substrate according to the adhesive composition of the present invention is not particularly limited. A silicon adhesive, a temperature sensitive adhesive, the adhesiveness of which can be adjusted by heating or cooling, or a UV adhesive peeled by ultraviolet irradiation can be used as the adhesive for transporting a flexible substrate. When a process of manufacturing a display device is performed at a temperature of 150° C. or less, all of the above adhesives can be used. However, when the process is performed at a temperature of 150° C. or more, it is preferred that the silicon adhesive be used considering chemical resistance and dimensional stability.

An adhesive composition for transporting a flexible substrate according to the present invention preferably includes (A) 45 to 80 parts by weight of a polydiorganosiloxane containing an alkenyl group; (B) 20 to 55 parts by weight of a polyorganosiloxane copolymer including $R^1_3SiO_{1/2}$ units and $SiO_2$ units, wherein $R^1$ is a hydroxy group or a monovalent hydrocarbon group of 1 to 12 carbon atoms; (C) a polyorganosiloxane containing an SiH group, wherein the molar ratio of the SiH group of the component (C) to the alkenyl group of the component (A) is from 0.5 to 20; (D) a platinum group catalytic compound, wherein the weight ratio of a metal component of the compound to the sum of the components (A) and (B) is from 1 to 5000 ppm by weight of metal; and (E) an antistatic agent of 0.001 to 5 parts by weight to the sum of the components (A) and (B).

Each component of the silicon adhesive composition according to the present invention is concretely described below.

For the silicon adhesive composition of the present invention, it is preferred that the contents of (A) a polydiorganosiloxane containing an alkenyl group and (B) a polyorganosiloxane copolymer including $R^1_3SiO_{1/2}$ units and $SiO_2$ units, wherein $R^1$ is a hydroxy group or a monovalent hydrocarbon group of 1 to 12 carbon atoms, be adjusted to provide the most suitable adhesive strength for transporting a flexible substrate. The weight ratio of the component (A) to the component (B) was adjusted to a range of 1:0.4 to 1:1.3, the composition was heated to a temperature of 200° C. for 1 hour and was then left at room temperature for 1 hour, and then the peel adhesive strength of the composition was measured at a peel rate of 300 mm/min and a peel angle of 180° using a tension testing device. The measured peel adhesive strength was from 10 to 300 g/25 mm.

When the weight ratio is below 1:0.4, the workability of peeling a plastic substrate from an adhesive layer is improved, but a substrate is not stably transported because bubbles are formed on an adhesive face, washing liquid infiltrates into the adhesive face, and the substrate is peeled from a support depending on the process conditions for transporting the flexible substrate, such as heating temperature and cleaning conditions.

When the weight ratio is above 1:1.3, process stability is excellent because the plastic substrate is fixed to the support, but the plastic substrate is easily cracked and deformed, or the silicon adhesive adheres to the plastic substrate at the time of peeling, because the plastic substrate is not easily peeled from the support after processes are completed.

The weight ratio of the component (A) to the component (B) is preferably from 1:0.4 to 1:1, more preferably from 1:0.5 to 1:0.95, still more preferably from 1:0.7 to 1:0.93, and most preferably from 1:0.8 to 1:0.92.

It is preferred that polydiorganosiloxane (A) containing the alkenyl group of the present invention has the following Formula (1):

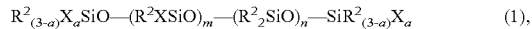

$$R^2_{(3-a)}X_aSiO-(R^2XSiO)_m-(R^2_2SiO)_n-SiR^2_{(3-a)}X_a \qquad (1),$$

wherein $R^2$ is a monovalent hydrocarbon group of 1 to 12 carbon atoms, which does not include an aliphatic unsaturated linkage, the X may be identical or different, each is an organic group or a hydroxy group containing an alkenyl group of 1 to 12 carbon atoms, provided that every X is not a hydroxy group, m is a number greater than or equal to 0, n is a number greater than or equal to 100, a is an integer number ranging from 0 to 3 in the case where X represents an alkenyl group, a is 1 in the case where X represents a hydroxy group, and a and m are not both 0.

In Formula (1), it is preferred that $R^2$ be one or more selected from the group consisting of a straight-chain or side-chain alkyl group of 1 to 6 carbon atoms, a cycloalkyl group of 3 to 8 carbon atoms, and an aryl group of 6 to 10 carbon atoms, which is unsubstituted or substituted with a straight-chain or side-chain alkyl group of 1 to 6 carbon atoms. It is more preferred that $R^2$ be one or more selected from the group consisting of a methyl group, an ethyl group, a propyl group, a butyl group, a cyclohexyl group, a phenyl group and a tolyl group.

Further, it is preferred that the organic group X containing an alkenyl group be one or more selected from the group consisting of a vinyl group, an allyl group, a hexenyl group, an octenyl group, an acryloyl propyl group, an acryloyl methyl group, a methacryloyl propyl group, a cyclohexenyl ethyl group and a vinyloxy propyl group.

It is preferred that the molar ratio of $R^1_3SiO_{1/2}$ units (M units) to $SiO_2$ units (Q units) in the polyorganosiloxane copolymer (B) be from 0.6 to 1.7. Adhesiveness and retentivity can be realized within that molar ratio.

It is preferred that $R^1$ be one or more selected from the group consisting of a straight-chain or side-chain alkyl group of 1 to 6 carbon atoms, a cycloalkyl group of 3 to 8 carbon atoms, and an aryl group of 6 to 10 carbon atoms, which is unsubstituted or substituted with a straight-chain or side-chain alkyl group of 1 to 6 carbon atoms. It is more preferred that $R^1$ be one or more selected from the group consisting of a methyl group, an ethyl group, a propyl group, a butyl group, a cyclohexyl group, a phenyl group and a tolyl group.

It is preferred that the content of SiOH unit be 4 parts or less by weight per 100 parts by weight of the polyorganosiloxane copolymer (B), wherein $R^1$ represents a hydroxy group in the polyorganosiloxane copolymer (B). When the content of SiOH unit is above 4 parts, the adhesiveness of the adhesive is decreased. Further, the component (B) may contain $R^1_3SiO_{3/4}$ units and $R^1_2SiO$ units as long as the characteristics of the present invention are not impaired. Two or more of component (B) may be used in combination.

Meanwhile, the components (A) and (B) may be used by simply mixing them, and condensation products of the components (A) and (B) may be used when the component (A) contains SiOH, wherein X of the component (A) is a hydroxy group. The condensation of the components (A) and (B) is performed by dissolving components (A) and (B) in a solvent such as toluene and reacting them at room temperature or in a reflux condition. The mixing ratio of component (A) to component (B) is, for example, from 45/55 to 70/30, and preferably from 50/50 to 65/35.

It is preferred that the straight-chain, branched-chain or cyclic polyorganosiloxane (C) containing an SiH group of the present invention have the following Formula (2) or Formula (3), wherein the polyorganosiloxane (C) is a crosslinking agent, and that the number of hydrogen atoms combined with silicon atoms in a molecule be 2 or more, and more preferably 3 or more:

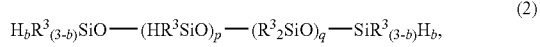

(2)

(3)

wherein each $R^3$ and $R^4$ is independently a monovalent hydrocarbon group of 1 to 12 carbon atoms,
b is 0 or 1,
p and q are arbitrary integer numbers,
s is an integer number greater than or equal to 2, t is an integer number greater than or equal to 0, and $s+t \geq 3$, and
each p+q and s+t has value such that the viscosity of the compound according to formula (2) or formula (3), respectively, is from 1 to 500 mPas at 25° C.

In Formulas (2) and (3), it is preferred that each $R^3$ and $R^4$ be one or more selected from the group consisting of a straight-chain or side-chain alkyl group of 1 to 6 carbon atoms, a cycloalkyl group of 3 to 8 carbon atoms, and an aryl group of 6 to 10 carbon atoms, which is unsubstituted or substituted with a straight-chain or side-chain alkyl group of 1 to 6 carbon atoms. It is more preferred that each $R^3$ and $R^4$ be one or more selected from the group consisting of a methyl group, an ethyl group, a propyl group, a butyl group, a cyclohexyl group, a phenyl group and a tolyl group.

It is preferred that component (C) be combined such that the molar ratio of SiH group of the component (C) to the alkenyl group of the component (A) be from 0.5 to 20, and particularly from 1 to 15. When the molar ratio is below 0.5, retentivity is decreased due to low crosslinking density. When the molar ratio is above 20, adhesiveness is not realized due to high crosslinking density.

The platinum group catalytic compound (D) according to the present invention is used to cure components (A) and (B) by facilitating an addition reaction therebetween. It is preferred that the component (D) be one or more selected from the group consisting of platinum black, chloroplatinic acid, chloroplatinic acid—olefin complex, chloroplatinic acid—alcohol coordination compound, rhodium, and rhodium-olefin complex. It is preferred that the weight ratio of the compound (D) to the sum of the components (A) and (B) be from 1 to 5000 ppm, and particularly from 5 to 2500 ppm by weight. When the weight ratio is below 1 ppm, retentivity is decreased because curability is decreased and crosslinking density is lowered. When the molar ratio is above 5000 ppm, shelf life is short because the reactivity and curing rate are increased.

It is preferred that the silicon adhesive composition according to the present invention further include an organic solvent in order to adjust the storage stability, coating properties, and viscosity of the adhesive. The content of the organic solvent is preferably 50 to 200 parts by weight per 100 parts by weight of the components (A) and (B) combined, but is not limited thereto. It is preferred that the organic solvent be at least one selected from the group consisting of toluene, xylene, ethylacetate, acetone, methylethylketone and hexane. More preferably, toluene and/or xylene may be used as the organic solvent.

It is preferred that the silicon adhesive composition according to the present invention further include a silane-based coupling agent of 3 to 10 parts by weight per 100 parts by weight of the components (A). It is preferred that the silane-based coupling agent be one or more selected from the group consisting of γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, vinyltriethoxysilane, γ-methacryloxypropyltrimethoxysilane, γ-methacryloxypropyltriethoxysilane, γ-aminopropyltriethoxysilane, 3-isocyanatopropyltriethoxysilane, and γ-acetoacetate propyltrimethoxysilane. Further, the silane-based coupling agent may be used by selecting one or mixing two or more.

The silicon adhesive composition according to the present invention may alternatively include components other than the above components. For example, nonreactive polyorganosiloxane, such as polydimethylsiloxane or polydimethyldiphenylsiloxane; a phenolic, quinone, amine, phosphorus, phosphate, sulfuric or thioether oxidation inhibitor; a triazole or benzophenone light stabilizer; a phosphoric ester, halogen, phosphorus or antimony fire retardant; an antistatic agent such as cationic active agent, anionic active agent or nonionic active agent; an toning agent; an adjuvant; a filler; an antifoaming agent; a surfactant; a plasticizer; an inorganic filler such as silica; or an additive such as a pigment may be additionally used.

In the adhesive composition for transporting a flexible substrate according to the present invention, the adhesive is not limited to a silicon adhesive.

When a process of manufacturing a display device is performed at a temperature of 150° C. or less, an acryl adhesive, such as a temperature sensitive adhesive the adhesiveness of which can be adjusted by heating or cooling, or a UV adhesive peeled by UV irradiation can be used as the adhesive for transporting a flexible substrate.

In the temperature sensitive adhesive, when a transition temperature, particularly primary transition temperature (melting point), is used, a so-called cold-peelable adhesive that is not adhesive at a predetermined temperature (for example, 25° C.) or less and a so-called warm-peelable adhesive that is not adhesive at a predetermined temperature (for example, 50° C.) or higher are used as the temperature sensitive adhesive.

The cold-peelable adhesive contains a side-chain crystalline polymer as a major component. The cold-peelable adhesive has adhesiveness at its melting point or higher, and has almost no adhesiveness at its melting point or lower.

With respect to the cold-peelable adhesive, it is preferred that the monomer constituting the polymer include 50% or more by weight of side-chain crystalline repeating units derived from (meth)acrylate ester and 50% or less by weight of side-chain amorphous repeating units derived from (meth) acrylate ester, and that the ratio of the adhesiveness above the melting point to the adhesiveness below the melting point be ⅓ or less. In —COOR$^c$ of the side-chain crystalline repeating unit, R$^c$ is a straight-chain or branched-chain alkyl group of a long chain having a carbon number of 14 or more, and in —COOR$^a$ of the side-chain amorphous repeating unit, R$^a$ is a straight-chain or branched-chain alkyl group of a short chain of 1 or more carbon atoms.

In the warm-peelable adhesive, the side-chain crystalline polymer is blended with a Pressure Sensitive Adhesive (PSA). The warm-peelable adhesive has adhesiveness above the melting point of the side-chain crystalline polymer, and has no adhesiveness below the melting point of the side-chain crystalline polymer. The composition for the temperature sensitive adhesive includes natural rubber adhesive, styrene-butadiene latex-based adhesive, butyl rubber, polyisobutylene, polyacrylate, acrylic copolymer adhesive, vinyl-ether copolymer adhesive and the like.

Further, the UV adhesive may include an elastomeric polymer, an ultraviolet crosslinking resin, a tackifier for adhesiveness, a polymerization initiator and a polymerization inhibitor. The ultraviolet crosslinking resin may include (meth) acrylate ester, which is a monomer or an oligomer crosslinked by applying ultraviolet rays. The polymerization initiator may include benzoyl alkyl ethers, aromatic oxyketones, or aromatic ketones which are commonly known polymerization initiators.

In the adhesive composition for transporting a flexible substrate according to the present invention, it is preferred that the antistatic agent be an ionic compound including an inorganic salt composed of a metal cation and an anion, or an organic salt composed of an onium cation and an anion. The ionic compound has excellent compatibility with an adhesive, thus preventing surface migration, is optically transparent, and maintains characteristics thereof even when mixed with one or more inorganic or organic salts. Further, it is possible to adjust the ionic conduction rate in order to prevent static electricity by adding the ionic compound in an amount ranging from 0.001 to 5 parts by weight to the adhesive composition.

Within the above weight range, a browning phenomenon and a bleaching phenomenon due to oxidation do not occur, bubbles are not generated, and the substrate does not peel, while chemical resistance, transmissivity, adhesiveness, antistatic properties and dimensional stability are maintained.

In the ionic compound, preferably, the anion is selected from the group consisting of iodide ($I^-$), chloride ($Cl^-$), bromide ($Br^-$), nitrate ($NO_3^-$), sulfonate ($SO_4^-$), methyl benzene sulfonate ($CH_3(C_6H_4)SO_3^-$), carboxybenzene sulfonate ($COOH(C_6H_4)SO_3^-$), benzoate ($C_6H_5COO^-$), perchlorate ($ClO_4^-$), hydroxide ($OH^-$), trifluoro acetate ($CF_3COO^-$), trifluoromethane sulfonate ($CF_3SO_2^-$), tetrafluoroborate ($BF_4^-$), tetrabenzylborate ($B(C_6H_5)_4^-$), hexafluorophosphate ($PF_6^-$), bis trifluoromethane sulfonimide ($N(SO_2CF_3)_2^-$), bis pentafluoroethane sulfonimide ($N(SOC_2F_5)_2^-$), bis pentafluoroethane carbonylimide ($N(COC_2F_5)_2^-$), bisperfluorobutane sulfonimide ($N(SO_2C_4F_9)_2^-$), bisperfluorobutane carbonylimide ($N(COC_4F_9)_2^-$), tris trifluoromethane sulfonyl methide ($C(SO_2CF_3)_3^-$), and tris trifluoromethane carbonyl methide ($C(SO_2CF_3)_3^-$), but is not limited thereto. It is further preferred that the anion be an imide anion, because the the imide anion serves well as an electron acceptor, and is readily substituted with fluorine having good hydrophobicity, thereby increasing ionic stability.

Further, the metal cation includes alkali metal or alkali earth metal cations, it is preferred that the metal cation be selected from the group consisting of lithium ($Li^+$), sodium ($Na^+$), potassium ($K^+$), rubidium ($Rb^+$), cesium ($Cs^+$), beryllium ($Be^{2+}$), magnesium ($Mg^{2+}$), calcium ($Ca^{2+}$), strontium ($Sr^{2+}$) and barium ($Ba^{2+}$), more preferably lithium ($Li^+$), sodium ($Na^+$), potassium ($K^+$), cesium ($Cs^+$), beryllium ($Be^{2+}$), magnesium ($Mg^{2+}$), calcium ($Ca^{2+}$) and barium ($Ba^{2+}$), and most preferably lithium ($Li^+$), which has high ionic stability and can be easily moved in the adhesive.

It is preferred that the onium cation be a nitrogen onium cation, a phosphorus onium cation or a sulfur onium cation. The term "onium" refers to a cation which has at least part of the electric charges thereof distributed on one or more nitrogen atoms, phosphorus atoms, or sulfur atoms.

The onium cation may be a cyclic cation, in which atoms form a ring, or a non-cyclic cation. The cyclic cation may be an aromatic saturated cation, or an aromatic unsaturated cation. The cyclic cation may contain one or more cyclic heteroatoms (for example, oxygen atoms or sulfur atoms) other than nitrogen atoms, phosphorus atoms, sulfur atoms and may be substituted with a substituent such as hydrogen, halogen, or an alkyl group or aryl group. The non-cyclic cation may contain an organic substituent or an R group, which is bonded with one or more (preferably 4 or more) nitrogen atoms, and the residual substituent of which is hydrogen. The R group may be cyclic or non-cyclic, substituted or non-substituted, aromatic or non-aromatic, and may contain one or more heteroatoms (for example nitrogen, oxygen, sulfur, phosphorus or halogen).

The adhesive composition according to the present invention may additionally include an electrolytic polymer to improve the ionic conduction rate in a polymer.

The electrolytic polymer includes polyalkylene oxides $((-(CH_2)_mO-)_n)$ such as polyethylene oxide $((-CH_2CH_2O-)_n)$, polypropylene oxide $((-CH_2C(CH_3)HO-)_n)$, or polybutylene oxide $((-(CH_2)_4O-)_n)$; polyalkylene sulfides $((-(CH_2)_mS-)_n)$ such as polyethylene sulfide $((-CH_2CH_2S-)_n)$, or polybutylene sulfide $((-(CH_2)_4S-)_n)$; polyalkylene imines $((-(CH_2)_mNH-)_n)$ such as polyethylene imine (($-CH_2CH_2NH-$)$_n$), or polybutylene imine (($-(CH_2)_4NH-$)$_n$); polyphenylene oxides (($-C_6H_4O-$)$_n$); and polyphenylene sulfides (($-C_6H_4S-$)$_n$), but is not limited thereto. In the above formula, m and n are integer numbers independently greater than or equal to 1.

Further, the adhesive composition according to the present invention may additionally include materials for improving ionic stability by forming a complex with alkali metals or alkaline earth metals when both the adhesive composition and the inorganic salt are used. The additive materials include the above electrolytic polymer, polyesters, polyvinylalcohols, polyvinyl carbonates or the like.

The transmissivity of the adhesive for transporting a flexible substrate according to the present invention must have a haze value of 1.0 or less, because there is a problem in that, in the case where an adhesive sheet is opaque or haze is generated thereon at the time of alignment using a laser, the adhesive sheet must additionally be provided with light transmission holes.

The present invention relates to an adhesive sheet including the above silicon adhesive composition. The adhesive sheet may include an adhesive layer in which the silicon adhesive composition is applied on a release film. Particularly, the adhesive layer may include a multi-layered structure coated with two or more adhesive compositions having different adhesiveness values. It is preferred that the surface tension of the release film be from 10 to 30 mN/m, and that the surface roughness thereof be 0.2 μm. The release film is easily detached within this numerical range.

Further, the present invention relates to a method of transporting a flexible substrate, including the steps of (a) forming an adhesive layer on a flexible substrate or a support; (b) attaching the flexible substrate and the support, one of which is provided with the adhesive layer, to each other, and then transporting the flexible substrate and the support; and (c) separating the flexible substrate from the adhesive layer and the support, wherein the adhesive layer includes the adhesive composition for transporting a flexible substrate according to the present invention.

It is preferred that the flexible substrate be one or more selected from the group consisting of a metal foil including aluminum foil and copper foil; and a plastic substrate including polyester, polytetrafluoroethylene, polyimide, polyphenylene sulfide, polyamide, polycarbonate, polystyrene, polypropylene, polyethylene, polyvinylchloride, polyethersulfone (PES) and polyethylene naphthalene (PEN).

The thickness of the adhesive layer is not particularly limited, and may be adjusted if necessary, but is preferably from 1 to 200 μm.

In the step (a) of forming an adhesive layer on a flexible substrate or a support, various commonly known methods may be used without limitation, but preferably, the adhesive layer is formed by applying an adhesive composition on the flexible substrate or the support using a coater. The coater may be selected from the group consisting of a bar coater, a roll coater, a reverse coater, a gravure coater and an air-knife coater. Further, in order to improve the adhesiveness between a base material and an adhesive layer, the adhesive layer formed by primary treatment, corona treatment, etching treatment, plasma treatment or thermal treatment may be used.

Further, the step (a) may include (d) forming an adhesive sheet by applying at least one adhesive composition on a release film, and (e) forming an adhesive layer by transferring the adhesive sheet to the flexible substrate or the support.

In the step (a) of forming an adhesive layer on a flexible substrate or a support, it is preferred that the coating amount of the adhesive composition be from 0.1 to 200 g/m².

The method of transporting a flexible substrate according to the present invention, wherein a silicon adhesive composition is used, may further include a step of heating the adhesive layer to a temperature of 80 to 200° C. for 10 to 300 sec between the step (a) and the step (b).

In the step (c), the peel adhesive strength of the adhesive layer to the support or the flexible substrate is preferably from 10 to 300 g$_f$/25 mm, more preferably from 20 to 200 g$_f$/25 mm, and most preferably from 30 to 120 g$_f$/25 mm. In particular, it is preferred that the peel adhesive strength of the adhesive layer to the support be higher than that of the adhesive layer to the flexible substrate.

The method of transporting a flexible substrate according to the present invention, which is the step of removing the adhesive layer applied on the support in the case where the adhesive composition that is used is a silicon adhesive composition, after the step (c), may further include (f) removing the adhesive layer from the support coated with the residual adhesive layer using at least one organic solvent selected from the group consisting of acetone and toluene, or (g) transferring an adhesive tape to an upper portion of the support coated with the residual adhesive layer and (h) separating the adhesive layer and the adhesive tape from the support.

It is preferred that the adhesive strength of the adhesive tape used to separate the adhesive layer be 500 g$_f$/25 mm or more.

Further, the method of transporting a flexible substrate according to the present invention may further include, after the step (c), (i) heating or cooling the support provided with the residual adhesive layer or (j) applying UV to the support provided with the residual adhesive layer, which is a step of removing an adhesive layer applied on a support in the case where the used adhesive composition is a temperature sensitive adhesive or a UV adhesive.

[Mode for Invention]

Hereinafter, a process of transporting a flexible substrate using a silicon adhesive composition according to an embodiment of the present invention will be described in detail with reference to the accompanying drawings.

First, a process of transporting a flexible substrate according to a first embodiment of the present invention will be described in detail.

FIGS. 1 to 4 are sectional views showing a process of transporting a flexible substrate according to a first embodiment of the present invention.

Referring to FIG. 1, a predetermined amount of adhesive composition 202 is placed on a flexible substrate 100, and then the adhesive composition 202 is spread on the flexible substrate 100 using a coater 110 at a constant rate. A commonly known coater in the related art, such as a bar coater, a roll coater, a reverse coater, a gravure coater or an air-knife coater, may be used as the coater 110.

Further, a plastic film such as polyester, polytetrafluoroethylene, polyimide, polyphenylene sulfide, polyamide, polycarbonate, polystyrene, polypropylene, polyethylene, polyvinylchloride, polyethersulfone (PES) or polyethylene naphthalene (PEN), or a metal foil such as aluminum foil and copper foil may be used as the flexible substrate 100.

Figure 2:
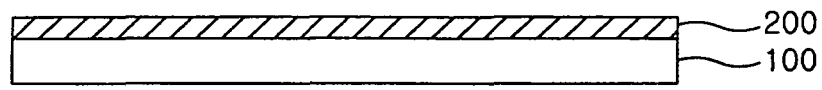
Figure 3:
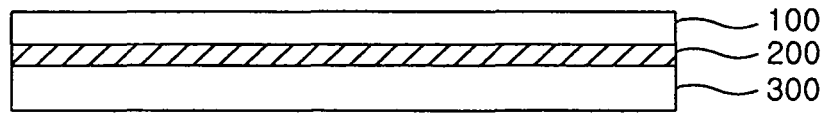

Meanwhile, the adhesive composition 202 may be diluted with a suitable organic solvent, and may be then applied on the flexible substrate 100. Accordingly, as shown in FIG. 2, an adhesive layer 200 is formed on the flexible substrate 100. Next, as shown in FIG. 3, a support 300 is adhered to the adhesive layer 200 formed on the flexible substrate 100.

Subsequently, the flexible substrate 100 fixed on the support 300 through the adhesive layer 200 is placed on a conveyor belt and is then transported to the location for manufacturing a panel. In the process of manufacturing a panel, processes of forming a resist on the flexible substrate 100 and etching and cleaning the same are performed using a conventional apparatus and processes for manufacturing a liquid crystal display device.

Figure 4:
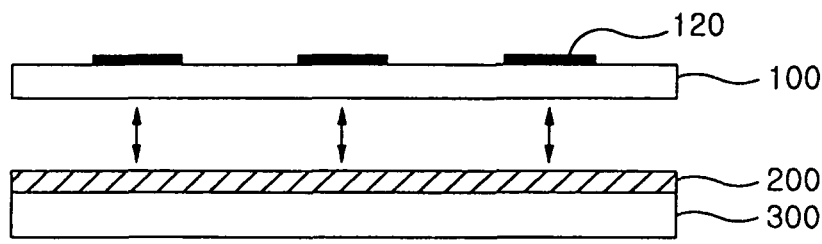

When the above processes are completed, as shown in FIG. 4, a pattern, such as transparent electrodes 120, is formed on the flexible substrate 100. Next, the flexible substrate 100 is separated from the support 300 after the last process.

In this case, the peel adhesive strength of the adhesive layer 200 to the support 300 is higher than that of the adhesive layer 200 to the flexible substrate 100. Accordingly, as shown in FIG. 4, when the flexible substrate 100 is separated from the support 300, only the flexible substrate 100 is separated from the support 300 with the adhesive layer 200 adhered to the support 300.

Meanwhile, it is obvious that the adhesive layer 200 may be formed by applying the adhesive composition 202 on the support 300, and then the support 300 is adhered to the flexible substrate 100, and it is preferred that the adhesive layer 200 be formed on the support 300 in advance.

Next, a process of transporting a flexible substrate according to a second embodiment of the present invention will be described in detail.

Figure 5:
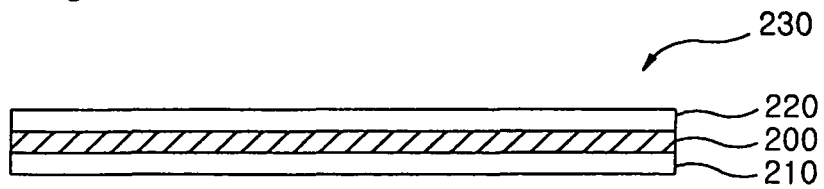
FIGS. 5 and 6 are sectional views showing adhesive sheets according to the present invention.
Figure 6:
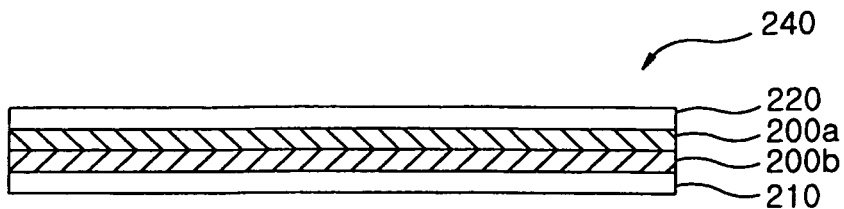

FIGS. 5 and 6 are sectional views showing adhesive sheets according to an embodiment of the present invention, and FIGS. 7 to 11 are sectional views showing a process of transporting a flexible substrate using the adhesive sheets in FIGS. 5 and 6 according to a second embodiment of the present invention.

According to the second embodiment of the present invention, an adhesive layer 200 is formed on a flexible substrate 100 in the form of an adhesive sheet 230. Referring to FIG. 5, the adhesive sheet 230 is formed by applying an adhesive composition for forming the adhesive layer 200 on a first release film 210 and then drying it. A second release film 220 is formed on the adhesive layer 200. The second release film 220 does not necessarily need to be provided.

The first and second release films 210 and 220 are easily separated from the adhesive layer 200 because they are treated with fluorine or silicon. Further, the surface tension of the first and second release films 210 and 220, which is measured through contact angle thereof, is from 10 to 30 mN/m (2 to 10 mN/m in polar part, 9 to 22 mN/m in dispersed part), preferably from 15 to 25 mN/m, and more preferably from 19 to 21 mN/m. Further, the surface roughness of the first and second release films 210 and 220, which is measured using a confocal laser scanning microscope, is preferably 0.2 µm or less, and more preferably 0.1 µm or less.

Referring to FIG. 6, the adhesive sheet 240 of the invention may be formed of a multi-layered structure having two or more adhesive layers 200a and 200b by applying two or more adhesive compositions having different adhesiveness. The two or more adhesive layers 200a and 200b are formed such that the peel adhesive strengths of the adhesive layers 200a and 200b to the support 300 are different from that of the adhesive layers 200a and 200b to the flexible substrate 100.

Hereinafter, for convenient explanation, a process of transporting a flexible substrate will be described in detail using an adhesive sheet in FIG. 5 of the above adhesive sheets.

Figure 7:
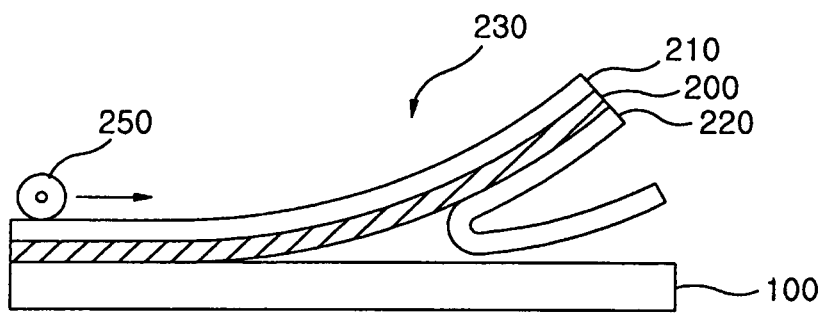
FIGS. 7 to 11 are sectional views showing a process of transporting a flexible substrate using the adhesive sheets in FIGS. 5 and 6 according to the second embodiment of the present invention.
Figure 8:
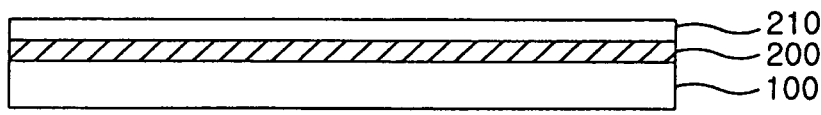

Referring to FIG. 7, an adhesive sheet 230 is transferred to a flexible substrate 100. For this transfer process, a second release film 220 is peeled from the surface of the adhesive sheet 230, and then the adhesive sheet 230 is placed on the flexible substrate 100 such that the surface of the adhesive layer 200 comes into contact with the surface of the flexible substrate 100.

Figure 9:
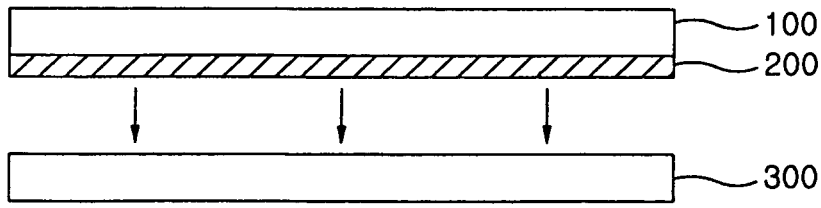

Next, a heated roller 250 is rolled on the placed adhesive sheet 230, and thus the placed adhesive sheet 230 is pressed onto the flexible substrate 100 as shown in FIG. 3B. Subsequently, as shown in FIG. 9, a first release film 210 is peeled and removed from the adhesive layer 200, and then the adhesive layer 200 is adhered to a support 300

Figure 10:
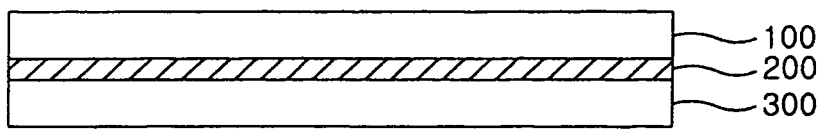

Subsequently, as shown in FIG. 10, the flexible substrate 100 fixed on the support 300 by the adhesive layer 200 is placed on a conveyor belt and is then transported to a location for a process of manufacturing a panel. In the process of manufacturing a panel, processes of forming a resist on the flexible substrate 100 and etching and cleaning the same are performed by using the conventional apparatus and processes for manufacturing a liquid crystal display device without change.

Figure 11:
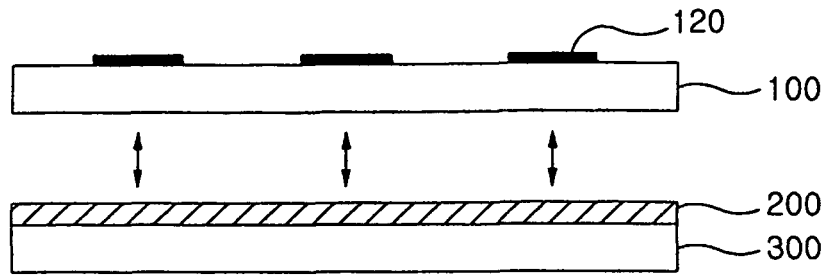

When the above processes are completed, as shown in FIG. 11, a pattern such as transparent electrodes 120 is formed on the flexible substrate 100. Next, the flexible substrate 100 is separated from the support 300 after the final process.

In this case, the peel adhesive strength of the adhesive layer 200 to the support 300 is higher than that of the adhesive layer 200 to the flexible substrate 100. Accordingly, as shown in FIG. 11, when the flexible substrate 100 is separated from the support 300, only the flexible substrate 100 is separated from the support 300, and the adhesive layer 200 continues to adhere to the support 300.

Meanwhile, it is obvious that the adhesive layer 200 may be formed by transferring the adhesive sheet 230 to the support 300, and then the support 300 may be adhered to the flexible substrate 100, and it is preferred that the adhesive layer 200 be formed on the support 300 in advance.

According to the first and second embodiments of the present invention, although the amount of the adhesive composition that is applied on the flexible substrate 100 or the support 300 is different depending on the material properties of the flexible substrate 100, it preferably ranges from 0.1 to 200 g/m$^2$, expressed as an amount of solid content. The thickness of the adhesive layer 200 is from 1 to 200 µm.

Further, the adhesive layer 200, formed on the flexible substrate 100 or the support 300 by applying the adhesive composition of the present invention thereon, may be heated to a temperature ranging from 80 to 200° C. for a time period ranging from 10 to 300 sec, so that a cured film is formed on the surface of the adhesive layer 200, thereby realizing desired peel adhesive strength and residual adhesiveness. When the curing temperature is 80° C. or less, a curing reaction, facilitated by a platinum catalyst for curing a silicon adhesive, does not occur. When the curing temperature is above 200° C., the flexible substrate 100 is damaged. Further, when the heating time is below 10 sec, the adhesive layer 200 is not sufficiently cured, and thus the adhesive layer 200 does not function as an adhesive, and weight variation due to residual materials is large. Accordingly, at the time of transporting the flexible substrate 100, bubbles are formed, so that the flexible substrate 100 detaches, thereby decreasing process stability. When the heating time is above 300 sec, the rate of formation of the adhesive layer is decreased.

The adhesiveness of the adhesive layer 200 is determined depending on the material properties of the support 300 or the flexible substrate 100, the thickness, surface shape, transport process conditions (heating temperature, washing condition), or peel workability etc. The adhesiveness can be adjusted by changing the shape of the surface of the adhesive layer 200, adjusting the polymerization degree and cross-linkage degree of the adhesive layer 200, adjusting the additives and curing agents, or changing the hardness. The peel adhesive strength of the adhesive layer 200 to the support or the flexible substrate preferably ranges from 10 to 300 g$_f$/25 mm. When the peel adhesive strength is below 10 g$_f$/25 mm, the ease with which the flexible substrate 100 is peeled from the adhesive layer 200 is improved, but the flexible substrate 100 is not stably transported because bubbles are formed on the adhesive face of the flexible substrate 100, a washing liquid infiltrates into the adhesive face, and the flexible substrate 100 is peeled from the support 300 depending on the transport process conditions (heating temperature, washing conditions). When the peel adhesive strength is above 300 g$_f$/25 mm, process stability is excellent because the flexible substrate 100 is fixed to the support 300, but the flexible substrate 100 is easily cracked and deformed, or the adhesive layer 200 adheres to the flexible substrate 100 at the time of peeling, because the flexible substrate 100 is not easily peeled from the support 300 after processes are completed.

According to the first or second embodiment of the present invention, the flexible substrate 100 is separated from the support 300 after the process of transporting the flexible substrate 100 is completed, and then the adhesive layer 200 remaining on the support 300 must be removed in order to reuse the support 300.

FIGS. 12 to 15 are sectional views showing a process of removing an adhesive layer from a support after the flexible substrate and support are separated according to an embodiment of the present invention.

Figure 12:
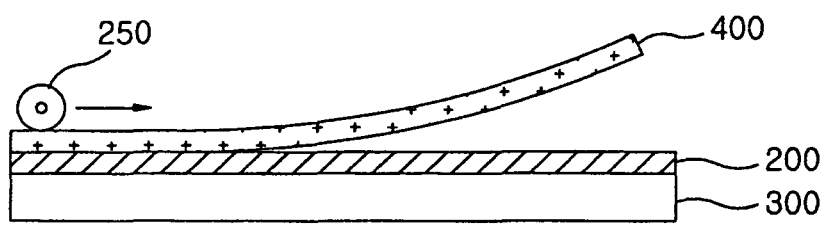
FIGS. 12 to 15 are sectional views showing a process of removing an adhesive layer from a support after the flexible substrate and support have been separated from each other according to an embodiment of the present invention.
Figure 13:
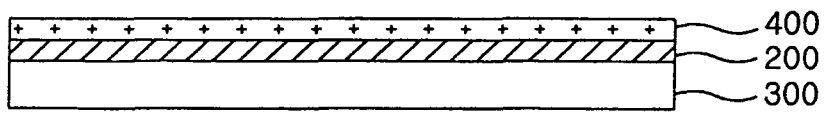
Figure 14:
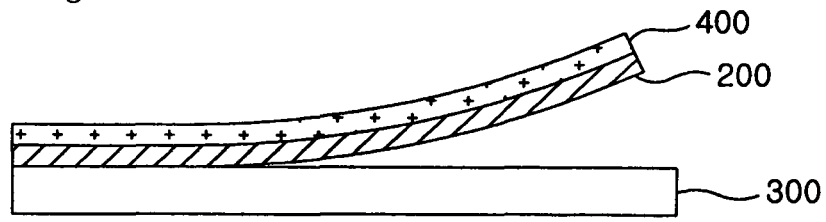
Figure 15:

Referring to FIG. 12, an adhesive tape 400 is transferred to a support 300 on which an adhesive layer 200 has been applied. That is, the adhesive tape 400 is placed on the surface of the adhesive layer 200, and then, as shown in FIG. 13, the adhesive tape 400 is pressed onto the adhesive layer 200 by moving a heated roller 250 on the adhesive tape 400. It is preferred that an adhesive having an adhesiveness of 500 g$_f$/25 mm be used as the adhesive tape 400. Next, when the adhesive tape 400 is removed, as shown in FIG. 14, the adhesive layer 200 is also removed. That is, both the adhesive tape 400 and the adhesive layer 200 are removed from the support 300 because the adhesiveness of the adhesive tape 400 to the adhesive layer 200 is higher than that of the adhesive layer 200 to the support 300. Accordingly, as shown in FIG. 15, a support 300 from which the adhesive layer 200 has been removed can be obtained.

Meanwhile, it is obvious that the adhesive layer 200 may be removed from the support 300 using an organic solvent such as acetone or toluene, rather than by the above method.

As described above, the adhesive composition for transporting a flexible substrate according to the present invention includes an ionic compound such as an inorganic salt or an organic salt, so that the adhesive composition exhibits heat resistance, chemical resistance, easy detachability from a substrate after processing, and dimensional stability, which are desired properties of an adhesive for transporting, during the process of manufacturing a display device, can prevent static electricity, and exhibits excellent optical transparency.

Hereinafter, the present invention will be described based on Examples and Comparative Examples. However, the present invention is not limited to the following Examples. The term "Parts" used in the following Examples means "parts by weight", and the term "characteristic value" is referred to as "measurement value" measured by the following test methods.

EXAMPLES

<Preparation and Combination of Silicon Adhesive>

Polydimethylsiloxane, containing an alkenyl group, wherein molecular chain ends of the Polydimethylsiloxane are blocked by a vinyl group, the Polydimethylsiloxane includes 0.15 mole % of methylvinylsiloxane units, and the Polydimethylsiloxane has a viscosity of 2200 mPa·s when it is dissolved with toluene to be 30% of a solid content; a toluene solution of 60% of polyorganosiloxane, including Me$_3$SiO$_{1/2}$ units and SiO$_2$ units (Me$_3$SiO$_{1/2}$ units/SiO$_2$ units=0.85); and 4 parts by weight of Me$_3$SiO—[MeHSiO]$_{40}$SiMe$_3$ serving as a crosslinking agent, were mixed, and thereby a silicon adhesive composition was prepared. Toluene and platinum catalyst were added to the composition in an amount of 100 parts by weight to have 30% of a solid content, a solution having 20% of solid content was prepared by dissolving an antistatic agent [lithium-bis-trifluoromethane-sulfonylimide (LiN(SO$_2$CF$_3$)$_2$)] into ethylacetate (EAc), and then the solution is added and combined with the composition, and thereby a silicon adhesive composition was prepared. The content and physical properties of the prepared composition are given in Tables 1 and 2, respectively.

The prepared composition was diluted to a suitable concentration and uniformly mixed, was applied to a PET release paper that had been treated with fluorine, and was then dried at a temperature of 140° C. for 3 minutes, thereby obtaining a uniform adhesive layer having a size of 30×25 cm$^2$ and a thickness of 25 μm.

<Substrate Manufacturing Process>

After a glass substrate having a thickness of 0.7 t was attached to one surface of the obtained adhesive layer and a PEN having a thickness of 200 μm was attached to the opposite surface thereof, physical properties necessary for an adhesive for transporting a substrate were measured.

TABLE 1

| | Composition of addition reactive silicon adhesive | | |
|---|---|---|---|
| | Alkenyl group (A) | MQ resin (B) | Antistatic agent (E) |
| Example 1 | 67.2 | 32.8 | 0.2 |
| Example 2 | 67.2 | 32.8 | 1 |
| Comparative Example 1 | 67.2 | 32.8 | 0 |
| Comparative Example 2 | 67.2 | 32.8 | 15 |
| Comparative Example 3 | 41.0 | 59.1 | 0.2 |
| Comparative Example 4 | 41.0 | 59.0 | 0.5 |

<Evaluation of Silicon Adhesive Characteristics>

1) Light Transmissivity

The light transmissivity of the silicon adhesive was evaluated by measuring the haze of the silicon adhesive. First, haze measurement samples were cut to a size of 40×70 mm$^2$, and then diffusion transmissivity Td and total transmissivity Ti were measured using an integral type transmissivity measuring device based on JIS K7150 and ASTM D 1003-95. The term "haze" is defined as Td, expressed as a percentage of Ti. The measurement samples were cured at a temperature of 200° C. for 24 hours, and then the haze was measured in the same way. The change of transmissivity due to the high temperature process was evaluated by comparing and evaluating haze characteristics before and after curing the measurement samples.

2) Peel Adhesive Strength

The adhesive applied to a fluorine release paper was cut to a size of 1 inch×6 inches, was attached to a piece of nonalkaline glass having a thickness of 0.7 mm or PEN having a thickness of 125 μm, was heated to a temperature of 200° C.

for 1 hour, and was left at room temperature for 1 hour, and then the peel adhesive strength of the adhesive was measured. In this case, the peel adhesive strength was measured at a peeling rate of 300 mm/min and a peel angle of 180° using a tension testing device.

3) Surface Resistance

A release film was removed from one side of the prepared adhesive, and then the surface resistance of an adhesive surface was measured. After a voltage of 500 V was applied to the adhesive surface, under the environment of 23° C. and relative humidity of 50% the surface resistance was measured, and then the measured surface resistance was observed.

4) Chemical Resistance

First, a silicon adhesive was attached to one surface of a glass substrate, and then PEN was attached to the other surface of the glass substrate. The glass substrate, to which the silicon adhesive and the PEN were attached, was put into an aluminum etching solution, an ITO etching solution and a photographic liquid, and then whether or not the adhesive was dissolved therein was observed. Further, the glass substrate, to which the silicon adhesive and the PEN were attached, was put into a 60° C. stripper solution, and then the chemical resistance thereof was observed. The aluminum etching solution was an aqueous solution composed of phosphoric acid (6%), acetic acid (9%) and nitric acid (4.5%), and the ITO etching solution is an aqueous solution composed of 5% of oxalic acid, and the photographic liquid was an aqueous solution composed of 2.4% of TMAOH (Tetramethyl Ammonium Hydroxide). Further, the stripper solution was composed of 10% of MEA (Mono Ethanol Amine), 30% of MNP(N-methyl Pyrrolidone) and 60% of BDG (Butyl-Di-Glycol).

5) Bubble Generation

First, a silicon adhesive was attached to one surface of a glass substrate, PEN was attached to the other surface of the glass substrate, and then the glass substrate to which the silicon adhesive and the PEN were attached was cured in an oven at a temperature of 200° C. for 1 hour. The difference in the number of bubbles generated before and after heat treatment using the oven was observed.

6) Detachability of a Substrate to a Support

After the heat resistance test related to bubble generation, detachability of a substrate to a support was measured by pulling the flexible substrate with the hands. Particular attention was paid to whether silicon adhesive was transferred to the substrate.

We claim:

1. An adhesive composition for transporting a flexible substrate, comprising:
    100 parts by weight of a silicon adhesive for transporting a flexible substrate; and
    0.001 to 1 parts by weight of an antistatic agent,
    wherein the antistatic agent is an inorganic salt composed of a metal cation and an anion, or an organic salt composed of an onium cation and an anion.

2. The composition of claim 1, wherein the composition comprises:
    (A) 45 to 80 parts by weight of a polydiorganosiloxane containing an alkenyl group;
    (B) 20 to 55 parts by weight of a polyorganosiloxane copolymer including $R^1{}_3SiO_{1/2}$ units and $SiO_2$ units, wherein $R^1$ is a hydroxy group or a monovalent hydrocarbon group of 1 to 12 carbon atoms;
    (C) a polyorganosiloxane containing an SiH group, wherein the molar ratio of the SiH group of component (C) to the alkenyl group of component (A) is from 0.5 to 20; and
    (D) a platinum group catalytic compound, wherein the weight ratio of a metal component of the compound to the sum of component (A) and component (B) is from 1 to 5000 ppm by weight; and
    (E) the antistatic agent of 0.001 to 1 parts by weight to the sum of component (A) and component (B).

3. The composition of claim 2, wherein the weight ratio of component (A) to component (B) is from 1:0.4 to 1:1.3.

4. The composition of claim 2, wherein the polydiorganosiloxane (A) containing an alkenyl group has the following Formula (1):

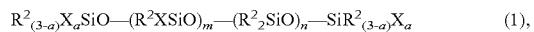

wherein $R^2$ is a monovalent hydrocarbon group of 1 to 12 carbon atoms, and not including an aliphatic unsaturated linkage, X may be identical or different, and each is an organic group containing an alkenyl group of 1 to 12 carbon atoms or a hydroxy group, provided that every X is not a hydroxy group, m is a number greater than or equal to 0, and n is a number greater than or equal to 100, a is an integer number ranging from 0 to 3 where X represents an alkenyl group,

TABLE 2

| | Physical properties of additive reactive silicon adhesive | | | | | | |
|---|---|---|---|---|---|---|---|
| | Peel adhesive strength (Glass) | Peel adhesive strength (PEN) | Surface resistance (Ω/□) | transmissivity | Chemical resistance | Bubble generation | Substrate detachability |
| Example 1 | 27.5 | 23.1 | $6.0 \times 10^{12}$ | 0.5 | Good | Not exist | ○ |
| Example 2 | 27.8 | 23.6 | $2.0 \times 10^{11}$ | 0.6 | Good | Not exist | ○ |
| Comparative Example 1 | 29.8 | 27.7 | Over* | 0.2 | Good | Not exist | ○ |
| Comparative Example 2 | 17.8 | 10.2 | $2.4 \times 10^{11}$ | 5.8 | Bad | Exist | ○ |
| Comparative Example 3 | 610.2 | 597.2 | $6.5 \times 10^{12}$ | 0.5 | Good | Not exist | X |
| Comparative Example 4 | 592.4 | 580.2 | $3.0 \times 10^{11}$ | 0.7 | Good | Not exist | X |

*Over: surface resistance is $1.0 \times 10^{14}$ Ω/□ or more a is 1 where X represents a hydroxy group, and
a and m are not both 0.

5. The composition of claim 2, wherein the molar ratio of $R^1_3SiO_{1/2}$ units to $SiO_2$ units in the polyorganosiloxane copolymer (B) is from 0.6 to 1.7.

6. The composition of claim 2, wherein $R^1$ is one or more selected from the group consisting of a straight-chain or branched-chain alkyl group of 1 to 6 carbon atoms, a cycloalkyl group of 3 to 8 carbon atoms, and an aryl group of 6 to 10 carbon atoms, which is unsubstituted or substituted with a straight-chain or branched-chain alkyl group of 1 to 6 carbon atoms.

7. The composition of claim 2, wherein an amount of the $R^1_3SiO_{1/2}$ unit wherein $R^1$ is a hydroxy group is 4 parts or less by weight to the total weight parts of the polyorganosiloxane copolymer (B), wherein $R^1$ represents a hydroxy group.

8. The composition of claim 2, wherein the straight-chain, branched-chain or cyclic polyorganosiloxane of (C) containing an SiH group has the following Formula (2) or Formula (3):

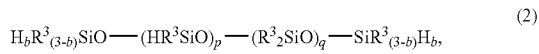

wherein each $R^3$ and $R^4$ is independently a monovalent hydrocarbon group of 1 to 12 carbon atoms,
b is 0 or 1,
p and q are arbitrary integer numbers,
s is an integer number greater than or equal to 2, t is an integer number greater than or equal to 0, and $s+t \geq 3$, and
each p+q and s+t has value such that the viscosity of the polyorganosiloxane according to Formula (2) or the Formula (3), respectively, is from 1 to 5000 mPa·s at 25° C.

9. The composition of claim 2, wherein the platinum group catalytic compound (D) is one or more selected from the group consisting of platinum black, chloroplatinic acid, a chloroplatinic acid—olefin complex, a chloroplatinic acid—alcohol coordination compound, rhodium, and a rhodium-olefin complex.

10. The composition of claim 1, wherein the anion is selected from the group consisting of iodide (I⁻), chloride (Cl⁻), bromide (Br⁻), nitrate ($NO_3^-$), sulfonate ($SO_4^-$), methylbenzene sulfonate ($CH_3(C_6H_4)SO_3^-$), carboxybenzene sulfonate ($COOH(C_6H_4)SO_3^-$), benzoate ($C_6H_5COO^-$), perchlorate ($ClO_4^-$), hydroxide (OH⁻), trifluoroacetate ($CF_3COO^-$), trifluoromethane sulfonate ($CF_3SO_2^-$), tetrafluoroborate ($BF_4^-$), tetrabenzylborate ($B(C_6H_5)_4^-$), hexafluorophosphate ($PF_6^-$), bis-trifluoromethane sulfonimide ($N(SO_2CF_3)_2^-$), bis-pentafluoroethane sulfonimide ($N(SOC_2F_5)_2^-$), bis-pentafluoroethane carbonylimide ($N(COC_2F_5)_2^-$), bis-perfluorobutane sulfonimide ($N(SO_2C_4F_9)_2^-$), bis-perfluorobutane carbonylimide ($N(COC_4F_9)_2^-$), tris-trifluoromethane sulfonylmethide ($C(SO_2CF_3)_3^-$), and tris-trifluoromethane carbonylmethide ($C(SO_2CF_3)_3^-$).

11. The composition of claim 1, wherein the metal cation is selected from the group consisting of lithium (Li⁺), sodium (Na⁺), potassium (K⁺), rubidium (Rb⁺), cesium (Cs⁺), beryllium ($Be^{2+}$), magnesium ($Mg^{2+}$), calcium ($Ca^{2+}$), strontium ($Sr^{2+}$) and barium ($Ba^{2+}$).

12. The composition of claim 1, wherein the onium cation is a nitrogen onium cation, a phosphorus onium cation or a sulfur onium cation.

13. An adhesive sheet comprising the adhesive composition for transporting a flexible substrate according to claim 1.

14. The adhesive sheet of claim 13, wherein the sheet includes an adhesive layer in which the adhesive composition is applied on a release film.

15. A method of transporting a flexible substrate, comprising the steps of:
(a) forming an adhesive layer on a flexible substrate or on a support;
(b) attaching the flexible substrate and the support, one of which is provided with the adhesive layer, to each other and then transporting the flexible substrate and the support; and
(c) separating the flexible substrate from the adhesive layer and the support,
wherein the adhesive layer comprises the adhesive composition for transporting a flexible substrate according to claim 1.

* * * * *